(12) United States Patent
    Caltabiano et al.

(10) Patent No.: US 10,985,131 B2
(45) Date of Patent: *Apr. 20, 2021

(54) MICROELECTRONIC DEVICE HAVING PROTECTED CONNECTIONS AND MANUFACTURING PROCESS THEREOF

(71) Applicant: STMicroelectronics S.r.l., Agrate Brianza (IT)

(72) Inventors: Daniele Caltabiano, Agrate Brianza (IT); Agatino Minotti, Mascalucia (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 16/830,613

(22) Filed: Mar. 26, 2020

(65) Prior Publication Data
    US 2020/0227375 A1    Jul. 16, 2020

Related U.S. Application Data

(63) Continuation of application No. 16/124,922, filed on Sep. 7, 2018, now Pat. No. 10,615,142.

(30) Foreign Application Priority Data

Sep. 15, 2017    (IT) .................. 102017000103511

(51) Int. Cl.
    *H01L 23/00*    (2006.01)
    *H01L 23/04*    (2006.01)
    (Continued)

(52) U.S. Cl.
    CPC .............. *H01L 24/48* (2013.01); *H01L 23/04* (2013.01); *H01L 23/10* (2013.01);
    (Continued)

(58) Field of Classification Search
    CPC ..... H01L 23/02–10; H01L 2924/10156; H01L 2924/15151; H01L 2924/15162;
    (Continued)

(56) References Cited

U.S. PATENT DOCUMENTS 3,397,278 A    8/1968 Pomerantz
3,657,610 A    4/1972 Yamamoto
    (Continued)

FOREIGN PATENT DOCUMENTS

EP    1557394 A1    7/2005
JP    2013125912 A  *  6/2013 ............. H01L 23/10

OTHER PUBLICATIONS

Machine translation, Naito, Japanese Pat. Pub. No. JP 2013-125912, translation date: Aug. 18, 2020, Espacenet, all pages (Year: 2020).*

*Primary Examiner* — Victoria K. Hall
(74) *Attorney, Agent, or Firm* — Slater Matsil, LLP (57) ABSTRACT

A microelectronic device includes a chip housing a functional part and carrying first electrical contact regions in electrical connection with the functional part through first protected connections extending over or in the chip. A substrate has a first contact area and a second contact area, which is remote from the first contact area. The first contact area carries second electrical contact regions, and the second contact area carries external connection regions. The second contact regions and the external connection regions are in mutual electrical connection through second protected connections extending over or in the substrate. A protection-ring structure surrounds the first and second electrical contact regions and delimits a first chamber closed with respect to the outside. The first electrical contact regions and the second electrical contact regions are in mutual electrical contact.

21 Claims, 5 Drawing Sheets

(51) Int. Cl.
*H01L 23/10* (2006.01)
*H01L 23/498* (2006.01)
*H05K 1/11* (2006.01)
*H05K 1/14* (2006.01)
*H01L 23/538* (2006.01)

(52) U.S. Cl.
CPC .... *H01L 23/49838* (2013.01); *H01L 23/5386* (2013.01); *H01L 24/80* (2013.01); *H01L 2224/48091* (2013.01); *H01L 2924/01013* (2013.01); *H01L 2924/01047* (2013.01); *H01L 2924/01079* (2013.01); *H05K 2201/09445* (2013.01)

(58) Field of Classification Search
CPC ..... H05K 2201/09445; H05K 2201/05; H05K 1/189; H05K 1/0213; H05K 2201/09027
USPC .......................................................... 174/261
See application file for complete search history.

(56) References Cited

U.S. PATENT DOCUMENTS

| | | | |
|---|---|---|---|
| 5,893,726 | A | 4/1999 | Farnworth et al. |
| 5,915,281 | A * | 6/1999 | Sparks ................... G01L 1/18 73/862.581 |
| 6,096,576 | A | 8/2000 | Corbin et al. |
| 6,238,951 | B1 | 5/2001 | Caillat |
| 6,313,529 | B1 | 11/2001 | Yoshihara et al. |
| 6,844,606 | B2 | 1/2005 | Logsdon et al. |
| 7,635,077 | B2 | 12/2009 | Schubert |
| 9,178,295 | B1 * | 11/2015 | Lin ........................ H05K 1/118 |
| 9,607,968 | B1 | 3/2017 | Jeong |
| 10,455,867 | B2 | 10/2019 | Donohoe et al. |
| 10,498,292 | B1 * | 12/2019 | Krvavac ................. H03F 3/195 |
| 10,615,142 | B2 * | 4/2020 | Caltabiano .............. H01L 24/48 |
| 10,861,999 | B2 * | 12/2020 | Morad ................ H01L 31/1876 |
| 2004/0262741 | A1 | 12/2004 | Koike et al. |
| 2005/0208696 | A1 | 9/2005 | Villa et al. |
| 2006/0125110 | A1 * | 6/2006 | Do .......................... H01L 24/11 257/778 |
| 2007/0267757 | A1 * | 11/2007 | Nakagawa ............ H01L 21/563 257/778 |
| 2009/0134508 | A1 | 5/2009 | Autry |
| 2010/0136748 | A1 | 6/2010 | Autry |
| 2012/0068325 | A1 * | 3/2012 | Montez .................. H01L 23/10 257/684 |
| 2012/0094614 | A1 * | 4/2012 | Komori .................. H04B 1/109 455/73 |
| 2012/0205790 | A1 * | 8/2012 | Haga ...................... H01L 24/29 257/676 |
| 2013/0101250 | A1 | 4/2013 | Desai et al. |
| 2014/0160673 | A1 * | 6/2014 | Sauciuc ................. H01L 23/36 361/679.54 |
| 2014/0355228 | A1 * | 12/2014 | Shi .......................... H05K 3/36 361/749 |
| 2015/0078589 | A1 * | 3/2015 | Uchida ................. H04R 19/04 381/174 |
| 2015/0078592 | A1 * | 3/2015 | Uchida ............... H04R 19/005 381/191 |
| 2015/0078593 | A1 * | 3/2015 | Uchida ............... H04R 19/005 381/191 |
| 2015/0156867 | A1 * | 6/2015 | Kim .................... G02F 1/13452 361/767 |
| 2015/0201492 | A1 * | 7/2015 | Kim ....................... H05K 1/028 361/749 |
| 2015/0208522 | A1 * | 7/2015 | Kim ..................... H01L 27/3297 361/749 |
| 2015/0303148 | A1 | 10/2015 | Kim et al. |
| 2016/0029487 | A1 * | 1/2016 | Kondo ................ B81C 1/00261 174/261 |
| 2016/0343629 | A1 | 11/2016 | Rajoo et al. |
| 2017/0034909 | A1 * | 2/2017 | Yamauchi .............. H05K 3/244 |
| 2017/0047498 | A1 * | 2/2017 | Dede ...................... H01L 35/32 |
| 2017/0170102 | A1 | 6/2017 | Ping et al. |
| 2017/0221790 | A1 | 8/2017 | Tomie et al. |
| 2018/0153039 | A1 * | 5/2018 | Lim ....................... H05K 1/111 |
| 2018/0158743 | A1 | 6/2018 | Watanabe et al. |
| 2019/0067137 | A1 | 2/2019 | Zhou et al. |
| 2019/0067847 | A1 * | 2/2019 | Chuo ................. G01R 31/2818 |
| 2019/0229089 | A1 | 7/2019 | Zhou et al. |
| 2019/0371703 | A1 * | 12/2019 | Matsuzaki ............. H01L 24/92 |
| 2019/0385931 | A1 * | 12/2019 | Eid ................... H01L 23/49822 |
| 2020/0008307 | A1 * | 1/2020 | Cho ....................... H05K 3/4691 |
| 2020/0043887 | A1 * | 2/2020 | Ogawa .................. H01L 23/057 |
| 2020/0144210 | A1 * | 5/2020 | Nishizawa ............. H01L 21/50 |
| 2020/0203240 | A1 * | 6/2020 | Haehn .................... H01L 21/563 |
| 2020/0211926 | A1 * | 7/2020 | Tahara .................. H01L 23/433 |

\* cited by examiner

MICROELECTRONIC DEVICE HAVING PROTECTED CONNECTIONS AND MANUFACTURING PROCESS THEREOF

CROSS-REFERENCE TO RELATED APPLICATIONS

This application is a continuation application of U.S. application Ser. No. 16/124,922, filed on Sep. 7, 2018, now U.S. Pat. No. 10,615,142, issued Apr. 7, 2020, which claims priority to Italian Patent Application No. 102017000103511, filed on Sep. 15, 2017, which applications are hereby incorporated herein by reference in their entirety.

TECHNICAL FIELD

The present invention relates to a microelectronic device having protected connections and to the manufacturing process thereof.

BACKGROUND

As is known, one of the techniques most widely used for electrically connecting microelectronic devices to other electronic devices or apparatuses is wired connection. To this end, the device to be connected has pads bonded to one end of one or more metal wires, also referred to as "bonding wires." Frequently, in particular when the microelectronic device operates in difficult environmental situations or in any case mechanical or chemical protection of the ends of the wires is required, the latter are protected, after bonding, by applying covering and protection masses, for example masses of thermosetting resin, such as epoxy resin, or the so-called moulding compound, or gels, such as an insulating gel, for example, potting gel, which protects the bonded ends from humidity.

However, for certain applications, it is difficult to find suitable protection materials. For instance, some materials are difficult to position in a precise way and may spread out and cover even functional parts of the device, thus jeopardizing operation thereof, for example in case of regions that must be free to move for proper operation (such as for sensing physical quantities or for actuation of a microelement), or regions that allow inlet/outlet of a fluid. In other cases, the materials are not chemically compatible with the external environment and may get damaged and no longer ensure protection. For instance, in case of pressure sensors inserted in the chamber for brake fluid, the latter may penetrate into the interface between the potting gel and the contact area, causing delamination and detachment of the gel. In other cases yet, these materials are not compatible and may get damaged or have insufficient performance in case of particular environmental or operating conditions (e.g., when operating at high pressures, they may deteriorate and no longer ensure protection).

SUMMARY

Embodiments of the present invention provide a solution that overcomes the drawbacks of the prior art.

According to the present invention, there are provided a microelectronic device and the manufacturing process.

For example, a microelectronic device comprises a chip housing a functional part and carrying first electrical contact regions in electrical connection with the functional part through first protected connections extending over or in the chip. A substrate has a first contact area and a second contact area, which is remote from the first contact area. The first contact area carries second electrical contact regions, and the second contact area carries external connection regions. The second contact regions and the external connection regions are in mutual electrical connection through second protected connections extending over or in the substrate. A protection-ring structure surrounds the first and second electrical contact regions and delimits a first chamber closed with respect to the outside. The first electrical contact regions and the second electrical contact regions are in mutual electrical contact.

In a particular embodiment, the microelectronic device is made up of two parts: a chip, which integrates the functional part of the device and has contact terminals or pads for electrical connection, and a substrate, which carries protected connections. The protected connections have a first end bonded to the pads of the chip and a second end, which is to be connected to the outside world. The area of the pads of the chip is surrounded by a first protection ring, and the area of the first ends of the substrate is surrounded by a second protection ring, having a shape and size that are congruent to those of the chip. The chip and the substrate are connected together; namely, the pads of the chip are bonded to the first ends of the substrate, and the first and second protection rings are bonded together. The first and second rings form in practice a composite ring that surrounds and protects, in the finished device, the pads of the chip and the first ends of the substrate. The second ends of the protected connections are arranged in an area remote from the first ends and may be connected to external pads. The substrate may be formed with a shape and size suitable for the application envisaged. Typically, it has a size that enables bonding of the second ends to an apparatus or further device arranged at a distance from the chip that allows the use of traditional protection materials, without any risk of damaging or jeopardizing operation of the chip or the protection ability of the protection material.

BRIEF DESCRIPTION OF THE DRAWINGS

For a better understanding of the present invention, preferred embodiments thereof are now described, purely by way of non-limiting examples, with reference to the attached drawings, wherein.

DETAILED DESCRIPTION OF ILLUSTRATIVE EMBODIMENTS

Figure 1:
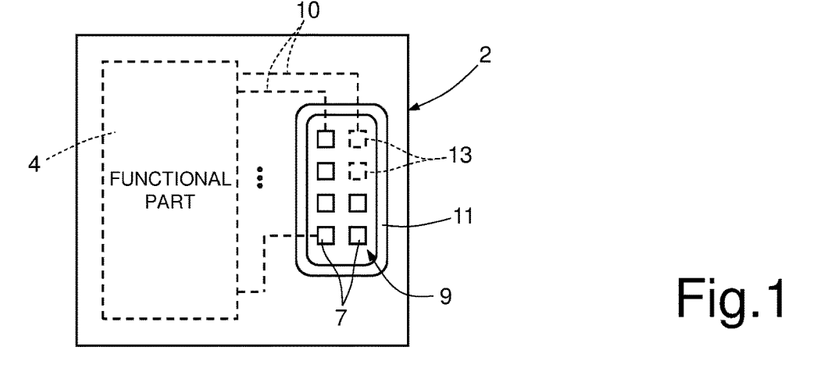
FIG. 1 is a top plan view of a first part of an embodiment of the present device, prior to assembly.
Figure 2:
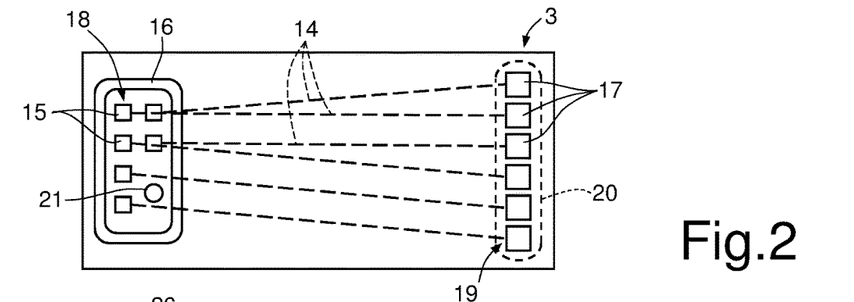
FIG. 2 is a plan view from below of a second part of an embodiment of the present device, prior to assembly.
Figure 3:
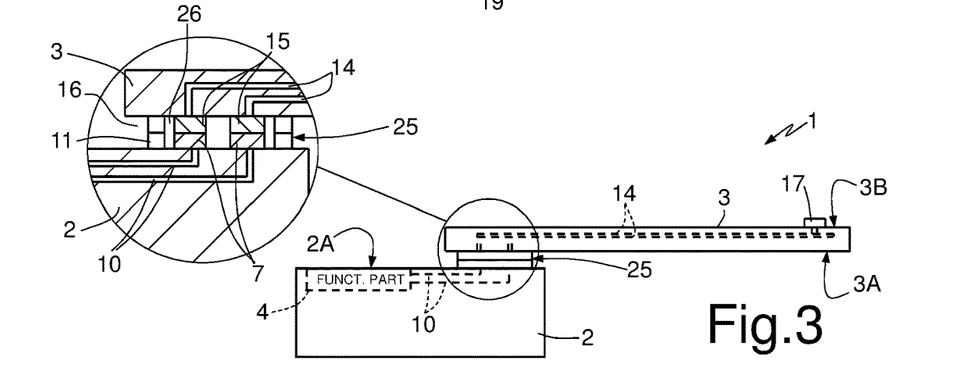
FIG. 3 is a side view of an embodiment of the present device, after assembly of the parts of FIGS. 1 and 2.

FIGS. 1 to 3 show an embodiment of a device 1 with protected connections. The device 1 comprises two parts: a chip 2 and a substrate 3. The chip 2 and the substrate 3 are coupled and fixed together, in particular bonded, prior to installation in the use position, and are illustrated, respectively, in FIGS. 1 and 2, prior to mutual fixing. FIG. 3 shows the device 1 after mutual bonding of the chip 2 and the substrate 3.

The chip 2 may be of semiconductor material, such as silicon, or ceramic, glass, a polymer, such as Kapton, coupled to a strain gauge and incorporating a functional part 4. The functional part 4 generally performs a typical function of the device 1; for example, it is an element for transducing physical quantities into electrical quantities (pressure sensor, microphone, inertial sensor, gas sensor, etc.), a microactuator (micromirror, optical selector, micromotor, etc.), an electronic circuit (electronic component or more complex circuit capable of carrying out signal processing and/or performing calculations, etc.) or the like.

The functional part 4 is connected to the outside of the chip 2 and exchanges electrical signals through contact regions, for example, first pads 7, arranged in a chip contact area 9, on a surface 2A of the chip 2 (FIG. 3). As illustrated schematically in FIGS. 1 and 3, the first pads 7 are electrically connected to the functional part 4 through first connection lines, here formed by buried connections 10 extending in the chip 2. The first pads 7 are surrounded by a first protection ring 11. The first protection ring 11 may be made of the same material as the first pads 7 or of a different material. For instance, the first pads 7 may be made of copper or aluminum, plated with silver or gold. The first protection ring 11 may be made of copper or aluminum plated with silver, gold, or nickel. Alternatively, the first protection ring 11 may be made of non-coated copper, or a polymer resistant to high temperature (higher than 275° C.) such as nylon, LCP (Liquid-Crystal Polymer), Kapton, Vespel.

Structures 13 other than the first pads 7 may also be arranged within the area delimited by the first protection ring 16. For instance, this area may accommodate structures 13 that it is desired to be accessible after manufacture of the chip 2 and to be protected during use, such as trimming resistors, temperature sensors, and the like.

The substrate 3 has a first contact area and a second contact area, designated by 18 and 19, housing respective contact regions. For instance, second pads 15 may be provided on the first contact area 18, arranged on a first surface 3A (FIG. 3) of the substrate 3 that, after bonding, faces the chip 2. The second pads 15 are in the same number as the first pads 7 of the chip 2, have the same layout and may have a similar size, so that they are aligned and may be bonded to the first pads 7 of the chip 2. The second pads 15 may be made of copper or aluminium, plated with silver or gold.

The second pads 15 are surrounded by a second protection ring 16, typically congruent with the first protection ring 11 (i.e., having the same shape, size, and position) so that it may be bonded to the latter. The second protection ring 16 may be of the same material as the first protection ring 11, for example copper or aluminum plated with silver, gold, or nickel, non-coated copper, or a polymer resistant to high temperature, such as nylon or LCP.

The first and second protection rings 11, 16 extend along a connected closed line, for example the perimeter of a rectangle with rounded corners, a circle, or an oval. Other shapes are, however, possible.

Further, on the second contact area 19, the substrate 3 has external connections 17, here on a second surface 3B, opposite to the first surface 3A. Alternatively, the external connections 17 may be arranged on the first surface 3A of the substrate, like the second pads 15. The external connections 17 are arranged remote from the chip 2. For example, if the substrate 3 has a strip-like elongated shape, the second pads 15 may be arranged at a first end, and the external connections 17 may be arranged at a second end, opposite to the first end, of the strip. The external connections 17 may be formed by third pads and have larger sizes and/or a layout such as to simplify bonding to an external apparatus or other electronic device. Optionally, the external connections 17 may be surrounded by an outer protection ring 20, represented by a dashed line in FIG. 2.

Second connection lines, which here form buried connections 14, extend within the substrate 3 and connect the second pads 15 to the external connections 17. Typically, each second buried connection 14 has a first end connected to a respective second pad 15 and a second end connected to a respective external connection 17. However, more complex connection schemes may be envisaged, if so desired.

The substrate 3 is made of composite material, typically insulating material housing the second buried connections 14. For instance, it may be made of flexible material such as Kapton, or of rigid material, such as a BT (Bismaleimide Triazine) laminate, or FR-4, or other material of printed-circuit boards. Alternatively, the substrate 3 may be multi-layered ceramic, e.g., LTCC (Low-Temperature Co-fired Ceramic). The second buried connections 14 may be arranged on a number of levels, if so desired, and exploit the known multi-layered PCB (Printed-Circuit Board) technologies, using internal layers of copper or other suitable material or multi-layered conductive/insulating inks.

As has been mentioned, the chip 2 and the substrate 3 are bonded or soldered together through the protection rings 11, 16, so as to form a composite ring 25, which mechanically and chemically protects the contact area 9. Further, the pads 7, 15 are bonded together to provide electrical continuity between the first buried connections 10 and the second buried connections 14. In practice, at the end of bonding, the composite ring 25 delimits and seals a first chamber 26 accommodating the pads 7, 15, bonded together (FIG. 3).

Bonding may be performed in a single step, by simultaneously soldering the pads 7, 15 to each other and the protection rings 11, 16 to each other, or in two separate steps, by soldering first the pads 7, 15 and then the protection rings 11, 16.

For instance, if the pads 7, 15 and the protection rings 11, 16 are of the same material (copper or aluminum, either naked or plated) they may be brazed at low temperature, by applying a solder paste, for example a tin-based paste (which melts at 220° C.), on one of the two parts (chip 2 or substrate 3) and pressing the two parts together at a low temperature (less than 300-400° C.). It is also possible to use a high lead bonding (Pb—Sn—Ag), which melts at 320° C. For instance, the solder paste may be applied by screen printing on the first pads 7 and on the first protection ring 11, and soldering may be carried out at 290° C.

Alternatively, the pads 7, 15 and the protection rings 11, 16 may be bonded via a high-power ultrasound process, in a way known in the electronics sector.

During and after bonding, it is desirable to prevent oxygen from remaining trapped within the first chamber 26, inside the composite ring 25, because it could cause, in the long run, oxidation of the pads 7, 15 and could thus lead to malfunctioning and failure.

To this end, bonding may be carried out at low pressure (as low as 10 mbar) using a gas-flushing technique, in particular with nitrogen, or at atmospheric pressure in a 100%-nitrogen environment, or again at atmospheric pressure in controlled environment, for example in forming gas (mixture of hydrogen and nitrogen, with at the most 10% hydrogen, for example 5% $H_2$ and 95% $N_2$).

According to a different solution, the substrate 3 has a degassing hole 21 extending throughout the thickness of the substrate 3 and opening out onto the first surface 3A of the substrate within the second protection ring 16 (FIG. 2). In this case, during bonding, any possible fumes deriving from the bonding process are free to exit from the first chamber 26 through the degassing hole 21. At the end of the bonding process, the degassing hole 21 may be sealed, for example via a protective resin, such as an epoxy resin, at the same time removing the air present in the chamber. To this end, sealing may be carried out at low pressure (as low as 10 mbar), for example, in a nitrogen environment, or by filling the first chamber 26 with controlled atmosphere (100% nitrogen) or using forming gas (e.g., 5% $H_2$ and 95% $N_2$).

In case of a two-steps soldering (either with pads 7, 15 and protection rings 11, 16 of the same material or when they are made of a different material), the pads 7, 15 are soldered first, for example, as mentioned above, via a tin-based paste applied by screen printing, at low pressure (as low as 10 mbar) or at atmospheric pressure in controlled atmosphere.

Next, the protection rings 11, 16 are bonded separately. If they are made of aluminum or copper, they may be bonded using tin-based paste or via a high-power ultrasound process, according to the techniques described above. If the protection rings 11, 16 are of polymeric material, they may be bonded via high-power ultrasound.

Figure 4:
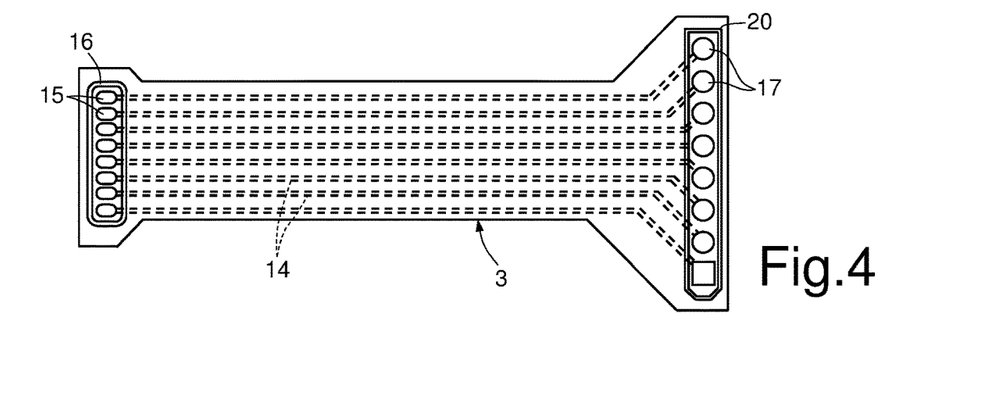
FIG. 4 is a top plan view of a different embodiment of the second part of the present device.

The substrate may have different shapes. For example, FIG. 4 shows a strip-shaped embodiment, with widened ends and second pads arranged aligned in a single row. In the example of embodiment of FIG. 4, further, the external connections 17 are surrounded by the third protection ring 20.

Figure 5:
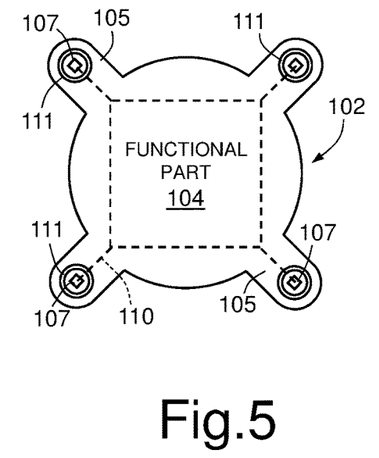
FIG. 5 is a top plan view of the first part of another embodiment of the present device.
Figure 6:
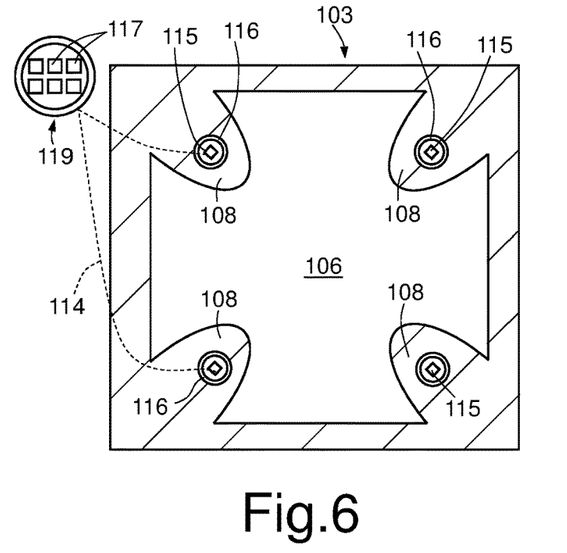
FIG. 6 is a plan view from below of the second part of an embodiment of the present device.

FIGS. 5 and 6 show a chip 102 and a substrate 103 according to a different embodiment.

Here, the chip 102 has a generally circular shape and has four first projections 105, arranged offset by 90° from each other, and projecting radially outwards from the periphery of the circular shape. Each first projection 105 here carries one or more first contact regions 107, and the first contact region or regions 107 arranged on a same first projection 105 is/are surrounded by a respective first protection ring 111. The chip 102 may, for example, be a pressure sensor, of ceramic material.

The chip 102 houses a functional part 104 electrically connected to the first pads 107 through first buried connections no extending in the chip 102 and represented only schematically, analogously to what described for the device 1 of FIGS. 1-3.

The substrate 103 is here shaped as a quadrangular plate, for example rectangular or square, having a much greater area than the chip 102, and comprises a frame portion internally delimiting an approximately cross-shaped through opening 106. Four second projections 108 extend from the frame portion towards the inside of the through opening 106, at 90° from each other. Each second projection 108 carries one or more second pads 115, in the same number as the first pads 107 of the chip 102. In practice, here, the first contact area is divided into four parts, each arranged on a respective second projection 108. Also here, the second pads 115 have the same layout and may have the same size as the first pads 107, so that they are aligned and may be bonded to the first pads 107 of the chip 102.

The second contact region or regions 115 arranged on a same second projection 105 is/are surrounded by a respective second protection ring 116, typically congruent with a respective first protection ring 111 (i.e., having the same shape, size, and position) so that they may be bonded together.

The substrate 103 further has a second contact area 119, arranged near a corner of the substrate 103, where external connections 117 may be arranged, for example pads. As illustrated schematically and as described for the external connections 17 of the substrate 3 of FIG. 2, the external connections 117 of the substrate 103 are connected to the second contact regions 115 through second buried connections 114, arranged in the substrate 103.

The materials of the first and second contact regions 107, 115 and of the first and second protection rings 111, 116 may be the same as above mentioned.

Also in this case, the chip 102 and the substrate 103 are bonded together through the protection rings 111, 116 so as to form composite rings that mechanically and chemically protect the areas of the pads 107, 115. Further, the pads 107, 115 are bonded together.

In addition, the substrate 103 may have a degassing hole (not illustrated), as described with reference to the device 1 of FIGS. 1-3.

Figure 7:
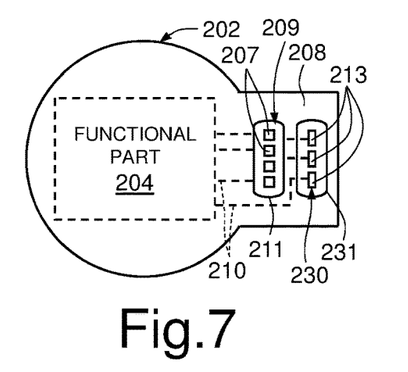
FIGS. 7 and 8 are a top plan view and a plan view from below, respectively, of a variant of the parts of the present device prior to their assembling.
Figure 8:
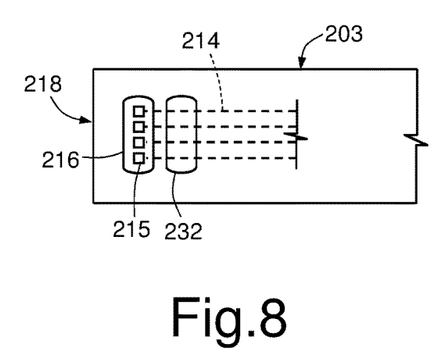
Figure 9:
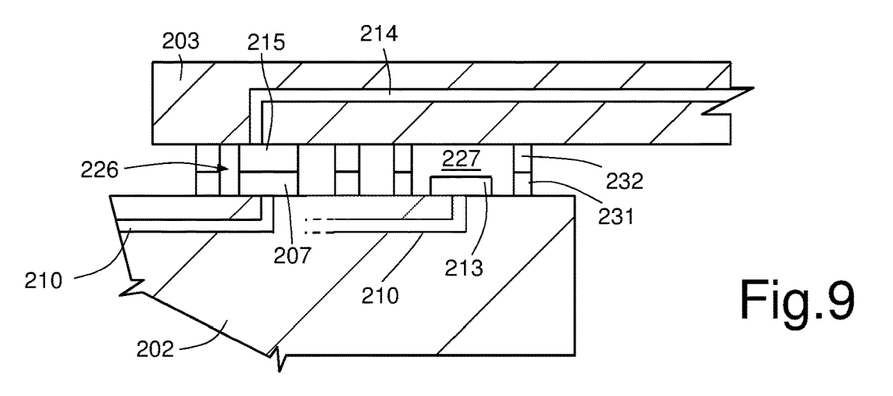
FIG. 9 is a side view of a portion of the present device, after assembling the parts of FIGS. 7 and 8.

FIGS. 7-9 show an embodiment where a separate protection structure is provided for further components that do not require connection to the outside world during use of the device. In particular, FIG. 7 shows a chip 202 with a circular shape, which houses a functional part 204 and is provided with a projection 208, here having a rectangular shape. The projection 208 carries a chip contact area 209, surrounded by a first protection ring 211, and a protected area 230, surrounded by a third protection ring 231. First pads 207 are arranged within the first protection ring 211, and structures to be protected 213 are arranged within the third protection ring 232. The structures to be protected 213 are, for example, trimming elements that it is desired to be accessible after manufacture of the chip 202, but that do not require connection to the outside world during use of the device and need to be protected during use.

Also here, the functional part 204 is electrically coupled to the first pads 207 through first buried connections 210.

FIG. 8 shows a part of a substrate 203, for example strip-like shaped as in FIG. 2 or 4, which carries at an end thereof second pads 215 surrounded by a second protection ring 216 (first contact area 218). A fourth protection ring 232 is arranged near the second protection ring 216. The second pads 215 are congruent to the respective first pads 207, the second protection ring 216 is congruent with the first protection ring 211, and the fourth protection ring 232 is congruent with the third protection ring 231. They are also arranged so as to be bondable together, as illustrated in the enlarged detail of FIG. 9. In this case, the third and fourth protection rings 231, 232 are bonded simultaneously and using the same technique for bonding the protection rings 211, 216. In this way, then, in addition to the electrical connection between the pads 207, 215 and their mechanical and chemical protection within the first chamber 215, a second composite ring 231, 232 is obtained, which defines a second chamber 227 and mechanically and chemically protects also the structures to be protected 213.

Also here, the substrate 203 may have through degassing holes (not shown), both inside the first chamber 226 and inside the second chamber 227; further, second buried connections 214 extend within the substrate 203 towards external connections (not shown), which are similar to the external connections 17 of FIG. 2.

Figure 10:
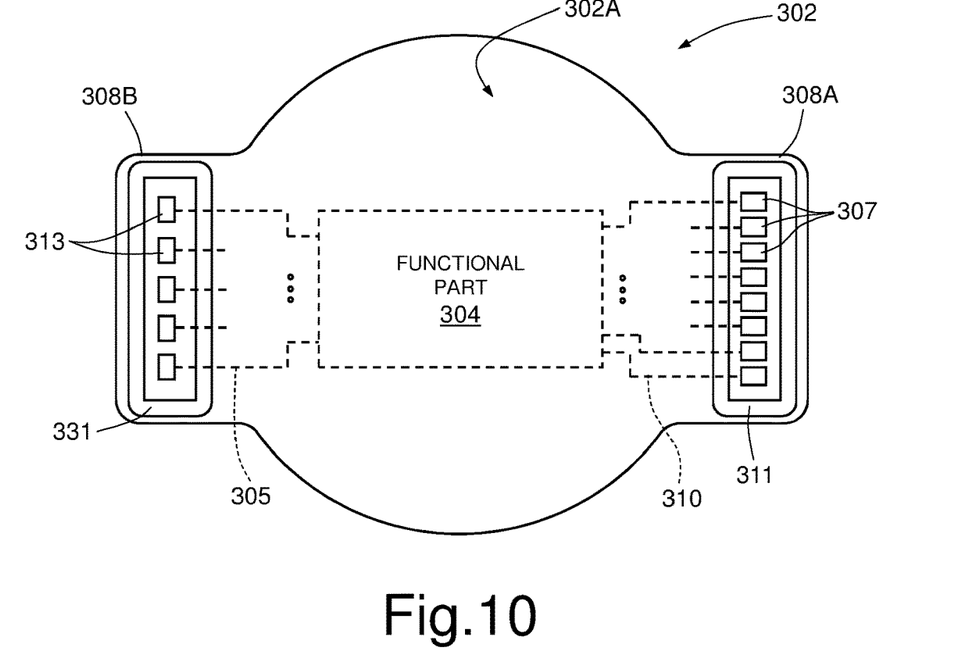
FIG. 10 is a top plan view of the first part of yet another embodiment of the present device prior to assembling.
Figure 11:
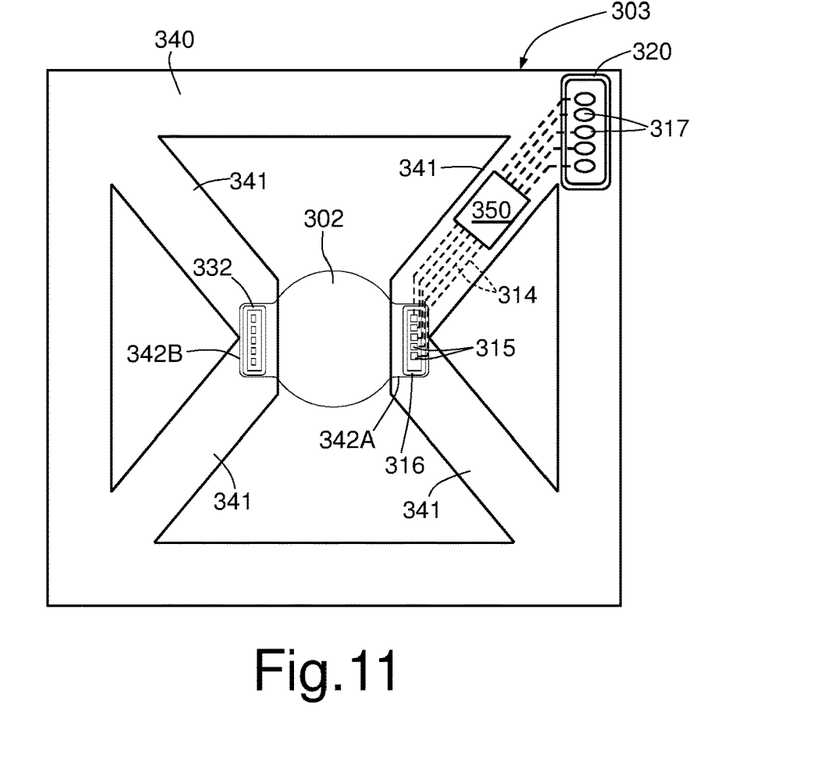
FIG. 11 is a plan view from below of the second part, coupled to the first part, in a see-through view, of the embodiment of the device of FIG. 10.

FIGS. 10-11 show another embodiment as a ceramic sensor. In particular, FIG. 10 shows a chip 302 having a generally circular shape provided with a first projection 308A and a second projection 308B. The projections 308A, 308B have a generally rectangular shape and are arranged in diametrically opposite positions of the chip 302.

The chip 302, for example a multi-layered ceramic having a surface 302A, houses electrical components defining a functional part 304. The electrical components may be formed within the body of the chip 302 and/or on the surface 302A. The functional part 304 is connected, via first buried connections 310, to first pads 307 formed on the surface 302A and arranged on the first projection 308A. The pads 307 are surrounded by a first protection ring 311. The second projection 308B carries, on the surface 302A of the chip 302, structures to be protected 313, surrounded by a third protection ring 331. The structures to be protected 313 may be electrically connected to the functional part 304 or directly to the first pads 307 through buried connections 305.

FIG. 11 shows a support 303 to be fixed to the chip 302 of FIG. 10. The support 303 is here formed by a frame 340, having a quadrangular shape, and four arms 341 extending inwardly from the corners of the frame 340. In detail, the arms 341 extend approximately along the two diagonals of the frame 341 and connect up, two by two, in proximity of the center of the support 303. In the example illustrated, the arms 341 do not extend exactly as far as the center, but form two pairs of adjacent arms 341 that join together in a first and in a second coupling areas, close to the center and designated by 342A, 342B; the coupling areas 342A, 342B correspond approximately to the position of the projections 308A, 308B of the chip, to which they are intended to be coupled.

On the first coupling area 342A, the support 303 has a second protection ring 316, congruent with the first protection ring 311, so that it may be bonded thereto. Second pads 315 are arranged in the second protection ring 316, in the same number and with the same layout as the first pads 307 of the chip 302. The second pads 315 are connected to second buried connections 314, which extend along and internally to one of the arms 341, up to a corner of the frame 340 where external connections 317 are provided. Here, the external connections 317, formed on the same surface as the support 303 that carries the second protection ring 316 and the second pads 315, are surrounded by an outer protection ring 320.

Furthermore, in the embodiment of FIG. 11, the arm 341 housing the second buried connections 314 also houses an electronic circuit 350, for example an ASIC, for processing the signals supplied by the functional part 304 of the sensor, or alternatively the electronic circuit 350 may be embedded in the arm 341.

On the second coupling area 342B, the support 303 has a fourth protection ring 332, congruent with the third protection ring 331, so that it may be bonded thereto and thus close hermetically (together with the third protection ring 331) the structures to be protected 313.

In a manner not shown, the coupling areas 342A, 342B may have degassing holes like the degassing hole 21 of FIG. 2.

For instance, the chip 302 may have a diameter of approximately 2-3 cm, and the substrate 303 may have a side of 10 cm.

Figure 12:
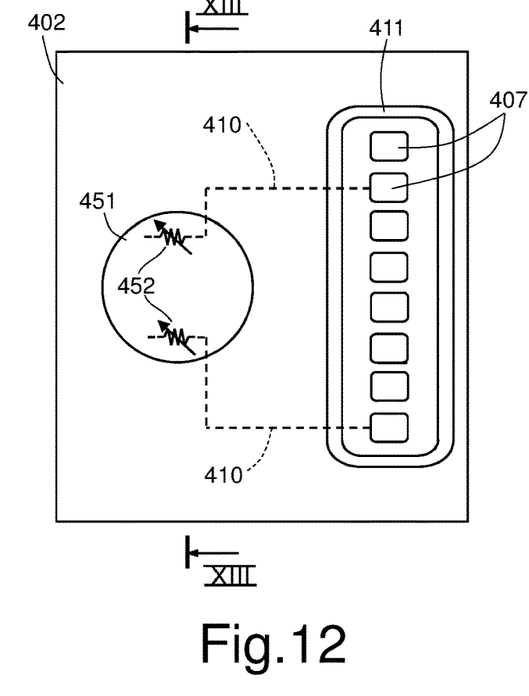
FIG. 12 is a top plan view of a first part of a further embodiment of the present device.
Figure 13:
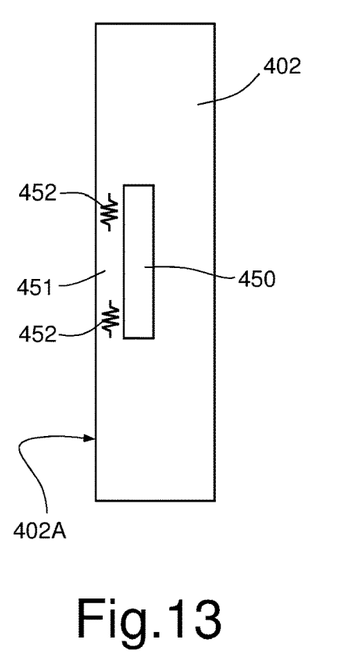
FIG. 13 is a cross-section of the first part of FIG. 12, taken along the line XIII-XIII.
Figure 14:
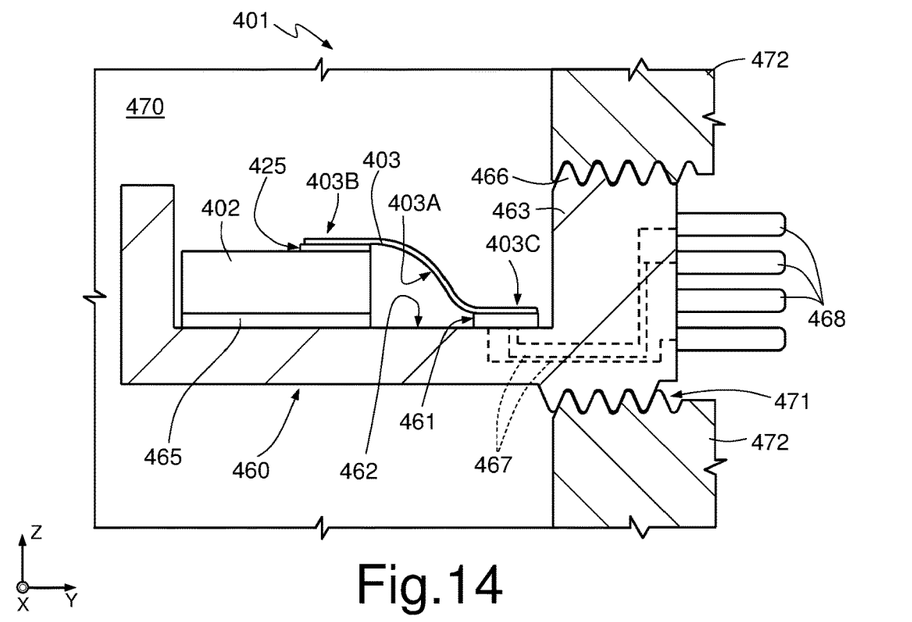
FIG. 14 shows in side view an application of an assembled including the first part of FIGS. 12 and 13.

FIGS. 12-14 refer to an embodiment of a device 401 forming a pressure sensor for braking systems of motor vehicles. The device 401 comprises a chip 402, here of semiconductor material and with a parallelepipedal shape, having a buried cavity 450 that may be seen in FIG. 13 and delimits at the bottom a portion of the chip 402 forming a membrane 451. The membrane 451 may house pressure-transducer elements, for example, piezoresistors (just one whereof is illustrated schematically in FIG. 12 and is designated by 452) or other elements capable of transducing stresses exerted on the membrane 451 into electrical signals, as, for example, described in US patent application US2005/208696.

The chip 402 has a surface 402A carrying first pads 407 receiving the electrical signals generated by the pressure-transducer elements 452 through first buried connections 410. The first pads 407 are surrounded by a first protection ring 411.

The chip 402 is coupled to a substrate 403 illustrated in FIG. 14. Here, the substrate 403 is of a flexible type, for example formed by a printed-circuit board of Kapton, strip-shaped, with a first surface 403A, a first end 403B, and a second end 403C. The substrate 403 may be configured like the substrate 3 of FIG. 3 and, at a first end, carries second pads (similar to the pads 15 and not visible) surrounded by a second protection ring (similar to the protection ring 16), which, in FIG. 14, is bonded to the first protection ring 411 of the chip 402 and forms a composite ring 425, like the composite ring 25 illustrated in the enlarged detail of FIG. 3. The first pads 407 of FIG. 12 are then bonded to corresponding second pads (not visible, similar to the pads 15 of FIG. 2), according to what is described above.

The second end 403C of the substrate 403 carries external connections (not visible), which are similar to the external connections 17 of FIG. 2 and are surrounded by an outer protection ring that is similar to the outer protection ring 20 of FIG. 2 and is bonded to a further protection ring fixed to a casing 460 so as to form an outer composite ring 461.

The casing 460 is here formed by a C-shaped container or support having a bottom surface 462 fixed to the chip 402, for example glued. For instance, the chip 402 may be fixed with a glue layer or an adhesive-tape layer 405. The casing 460 is of rigid material resistant to the fluids in which it is immersed; for example, it may be a multi-layered ceramic or metal with some parts of glass and pins of Kovar (glass-to-metal sealing technology). The casing 460 may have a generally tubular shape in side view (parallel to an axis Y of a Cartesian reference system XYZ) so as to define a side wall 463 (close to the second end 403C of the substrate 403) having a disk-like shape having peripherally a thread 466. Further, the casing 460 houses external electrical connections 467, which connect pads (not visible, formed on the bottom surface 462 and protected by the outer composite ring 461) to external contacts 468, which project from the side wall 463. The external electrical connections 467 are typically embedded in the casing 460.

In practice, the contacts 468 are connected, through the external electrical connections 467, the pads (not visible) on the bottom surface 462 of the package 460, the pads (not visible) on the second end 403C of the substrate 403, buried connections (not visible) extending in the substrate 403, second pads (not visible) on the first end 403B of the substrate 403, the first pads 407 (FIG. 12) of the chip 402, and the first buried connections 410, to the pressure-transducer elements 452 of FIG. 12.

In use, the casing 460, with the chip 402 and the substrate 403, is inserted in a chamber 470 to be filled with a brake fluid and screwed, via the thread 466, to a corresponding internal thread 471 on brake calipers 472.

Figure 15:
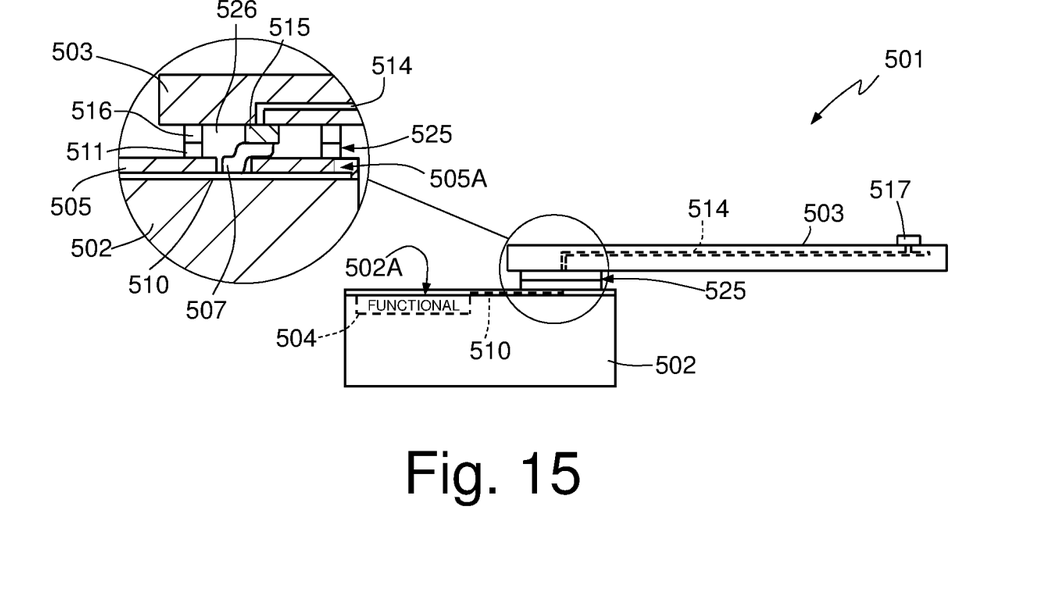
FIG. 15 is a side view of another embodiment of the present device.
Figure 16:
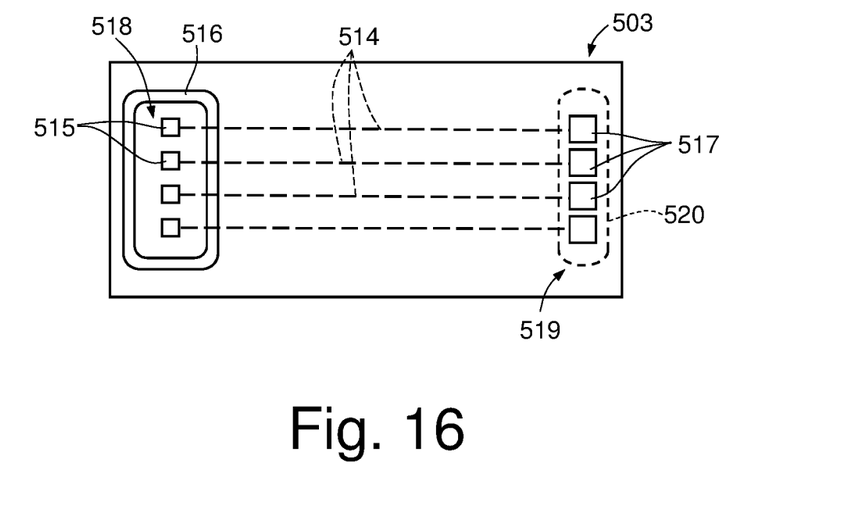
FIG. 16 is a view from below of the second part of the device of FIG. 15, prior to assembly.

FIGS. 15 and 16 show a device 501 similar to the device 1 of FIGS. 2 and 3, wherein the chip 502 is, for example, of silicon or ceramic and carries first connection lines 510 on its surface 502A. The first connection lines 510 are formed in a first metal layer also extending over the area of the protection ring 525 and are covered by a dielectric layer 505, for example, of silicon oxide, which is removed only in part within the first chamber 526. Here, the dielectric layer 505 has one or more openings that expose the ends of the first connection lines 510 and form one or more reliefs 505A. Contact portions 507 of metal material (one for each first connection line 510) extend in part over the exposed ends of the first connection lines 510 and in part over the reliefs 505A formed by the dielectric layer 505 and face the second pads 515. They thus form first pads, similar to the first pads 7 of FIG. 3. The contact portions 507 may be of the same material and have the same step as the first protection ring 511; for example, they may be made of copper or aluminum, plated with silver or gold.

For the rest, except for the layout in a single row of the pads 507, 515, the device 501 of FIGS. 15 and 16 is the same as the device 1 of FIGS. 1-3. Thus, the other parts of the device 501 are designated by the reference numbers of FIGS. 1-3, increased by 500.

The advantages of the present device are evident from the above.

In particular, the presence of a substrate that in practice transfers the pads in a position remote from the chip makes it possible to provide the electrical connections with the outside world in a less critical position, where no materials are present that might damage the contacts or where the contact materials do not disturb operation of the device. The connections between the contacts of the chip and the corresponding contacts of the substrate are protected by rings that provide mechanical, chemical, and physical protection.

The rounded shape of the protection rings prevents the presence of areas where concentration of stresses may arise and could cause failure or cracking of the protection rings.

The device described herein may advantageously be used as inertial microsensor, magnetic microsensor, pressure microsensor, humidity microsensor, UV microsensor, microtransducer, microphone, gas microsensor, distance microsensor, microactuator, micromirror, optical microselector, micromotor, and signal-processing electronic circuit.

Finally, it is clear that modifications and variations may be made to the device described and illustrated herein, without thereby departing from the scope of the present invention, as defined in the attached claims. For instance, the various embodiments described may be combined so as to provide further solutions.

The chip 2 may even be a complex, non-monolithic, chip, for example formed by a multiple structure of a number of chips arranged on top of each other and bonded together.

In the embodiments of FIGS. 6 and 11, the frame portion of the substrate 303 may extend along a closed line or an open line formed by stretches connected by the arms 341.

The components to be protected 13, 213 may be arranged within the first chamber 26 or within the second chamber 227 or within both; for example, some components may be provided within the first chamber 26 and others within the second chamber 227, when the latter is present.

The shape of the substrate may be any according to the needs and the desired application; for example, in addition to the illustrated strip and quadrangular shapes, the substrate may also have a circular shape, or a polygonal shape, either regular or irregular.

What is claimed is:

1. A device comprising:
a chip comprising a circular shape with a first plurality of protruding regions, each of the first plurality of protruding regions comprising a first contact pad surrounded by a first protection ring;
a substrate comprising a quadrangular shape and comprising a frame portion and a second plurality of protruding regions projecting towards a central portion of the substrate, each of the second plurality of protruding regions comprising a second contact pad surrounded by a second protection ring; and
a plurality of chambers, each of the plurality of chambers delimited by an associated one of the first protection ring and the second protection ring, each of the first contact pad coupled to an associated one of the second contact pad, each of the first and the second contact pads being disposed in the associated chamber.

2. The device according to claim 1, wherein the first protection ring and the second protection ring are bonded together to form a first protection-ring structure.

3. The device according to claim 2, wherein the first protection ring and the second protection ring comprise a material selected from the group consisting of copper or aluminum plated with silver, gold, or nickel, non-coated copper, and a polymer.

4. The device according to claim 2, further comprising a tin-based bonding paste disposed between the first protection ring and the second protection ring.

5. The device according to claim 1, wherein the chip comprises a semiconductor or ceramic material.

6. The device according to claim 1, further comprising
external contacts disposed on the substrate for coupling the chip to external circuits; and
electrical connections disposed within the substrate, the electrical connections coupling the second contact pad to the external contacts of the substrate.

7. The device according to claim 6, wherein the substrate comprises an insulating material embedding the electrical connections.

8. The device according to claim 6, wherein the substrate comprises a material selected from the group consisting of Kapton, laminated material, BT (Bismaleimide Triazine), FR-4, and ceramic.

9. A device comprising:
a chip comprising a first projection and a second projection, the first projection comprising a first contact pad surrounded by a first protection ring, the second projection comprising a structure to be protected surrounded by a second protection ring;

a substrate comprising a quadrangular shape and comprising a frame, a plurality of arms projecting towards a central portion of the substrate, a first area at a first intersection between two adjacent ones of the plurality of arms, and a second area at a second intersection between another two adjacent ones of the plurality of arms, the first area comprising a second contact pad and surrounded by a third protection ring, the second area surrounded by a fourth protection ring;

a first chamber formed by the first protection ring and the third protection ring and closed to the outside; and a second chamber formed by the second protection ring and the fourth protection ring and closed to the outside, the first contact pad and the second contact pad being disposed in the first chamber, the structure to be protected being disposed in the second chamber.

10. The device of claim 9, further comprising:
an external connection disposed on the frame of the substrate and coupled to the first contact pad.

11. The device of claim 10, further comprising:
a buried connection disposed in one of the plurality of arms, the buried connection coupling the second contact pad to the external connection.

12. The device of claim 9, further comprising:
a buried connection disposed in the chip and coupling a functional part of the chip and the first contact pad.

13. The device of claim 12, further comprising:
an electronic circuit disposed in one of the plurality of arms, the electronic circuit configured to process signals supplied by the functional part of the chip.

14. The device of claim 13, wherein the functional part comprises a sensor.

15. The device of claim 9, further comprising:
a first degassing hole disposed in the first area; and
a second degassing hole disposed in the second area.

16. A system comprising:
a casing comprising a first major surface;
a chip comprising a first side and a second side, the first side of the chip attached to the first major surface of the casing;
a substrate attached to the second side of the chip;
a first composite ring connecting a first end of the substrate to the second side of the chip; and
a second composite ring connecting a second end of the substrate to the first major surface.

17. The system of claim 16, further comprising:
external connections disposed at the second end of the substrate, the external connections closed to the outside by the second composite ring.

18. The system of claim 17, wherein the second composite ring comprises an outer protection ring surrounding the external connections, the outer protection ring bonded to a further protection ring fixed to the casing.

19. The system of claim 18, further comprising:
external contacts protruding from the casing, the external contacts coupled to the external connections through external electrical connections embedded in the casing.

20. The system of claim 16, further comprising:
a chamber, the casing being attached to the chamber;
brake calipers with internal thread for supporting corresponding threads of the casing; and
a brake fluid within the chamber.

21. The system of claim 16, wherein the chip comprises membrane comprising a piezoresistor and a buried cavity delimiting at a bottom portion of the chip to form the membrane.

* * * * *